United States Patent [19]

Koike et al.

[11] Patent Number: 5,047,309
[45] Date of Patent: Sep. 10, 1991

[54] PHOTOSENSITIVE DIAZONIUM RECORDING MATERIAL WITH SULFUR COMPOUND CONTAINING UNDERCOAT LAYER

[75] Inventors: Akinobu Koike; Keiji Akiyama, both of Shizuoka, Japan

[73] Assignee: Fuji Photo Film Co., Ltd., Minami-Ashigara, Japan

[21] Appl. No.: 362,255

[22] Filed: Jun. 6, 1989

[30] Foreign Application Priority Data

Jun. 7, 1988 [JP] Japan .................................. 63-139678

[51] Int. Cl.$^5$ ........................... G03C 1/52; G03C 1/76
[52] U.S. Cl. ..................................... 430/159; 430/161; 430/175; 430/176; 430/179; 430/278; 430/302
[58] Field of Search ............... 430/161, 175, 179, 278, 430/159, 176

[56] References Cited

U.S. PATENT DOCUMENTS

| | | | |
|---|---|---|---|
| 3,078,162 | 2/1983 | Bialczak et al. | 430/161 |
| 3,288,627 | 11/1966 | Bialczak | 430/161 |
| 3,549,365 | 12/1970 | Thomas | 430/161 |
| 3,875,316 | 6/1971 | Velten et al. | 430/179 |
| 4,052,217 | 10/1977 | Watkinson | 430/278 |
| 4,275,138 | 6/1981 | Kita et al. | 430/278 |
| 4,301,229 | 11/1981 | Sakaki et al. | 430/278 |
| 4,467,028 | 8/1984 | Huang et al. | 430/278 |
| 4,801,527 | 1/1989 | Takamiya et al. | 430/278 |

Primary Examiner—Charles L. Bowers, Jr.
Assistant Examiner—Christopher G. Young
Attorney, Agent, or Firm—Burns, Doane, Swecker & Mathis

[57] ABSTRACT

A photosensitive recording material comprising (a) a substrate having a hydrophilic surface, (b) an undercoating layer comprising at least one compound having at least one functional group selected from the group consisting of thiol, thioether and disulfide groups, and (c) a photosensitive layer comprising at least one diazonium compound and a high molecular weight binder compound which is insoluble in water and soluble in aqueous alkaline solution. The resulting developed plate yields no background contamination in printing process.

15 Claims, No Drawings

PHOTOSENSITIVE DIAZONIUM RECORDING MATERIAL WITH SULFUR COMPOUND CONTAINING UNDERCOAT LAYER

BACKGROUND OF THE INVENTION

1. Field of the Invention

The present invention relates to a photosensitive recording material, more specifically to a photosensitive material having an improved developing property in a developing process using an aqueous alkaline-developing solution, which is suitable for negative-working photosensitive lithographic plate, color proof, photoresist and the like.

2. Description of the Prior Art

Most photosensitive substances used in negative-working photosensitive composition are diazomium compounds. Among them, diazo resins, such as a formaldehyde condensate of p-diazodiphenylamine are most widely used as photosensitive substances.

A photosensitive composition of a photosensitive layer of a photosensitive lithographic plate using a diazo resin can be generally classified into the following two groups. One of them is a photosensitive composition containing a diazo resin without containing any binder such as disclosed, for example, in U.S. Pat. No. 2,714,066. The other is a one which comprises a diazo resin admixed with a binder component. Recently, most of photosensitive lithographic plates using diazonium compounds comprise diazonium compounds and polymer binders to attain high printing durabilities of the resulting lithographic plates.

The above mentioned photosensitive layer are generally developed in an aqueous-alkaline developing solution which can remove unexposed areas from the photosensitive layer. However, especially in the case of a photosensitive lithographic plate, it has been known that a developing property become degraded as a storage time goes by after the production of the plate, which results in background contamination in printing process. Background contamination in printing would arise in the case where a lithographic plate is used after storage for a certain period even if background contamination does not arise in the case where it is used immediately after the production. The above disadvantages are particularly remarkable when the plates are stored under a hot and humid condition. It has been desired, therefore, to obtain a photosensitive lithographic plate which can be stored for a long time, especially under a hot and humid condition, without yielding background contamination in printing process.

Many proposals have been reported to overcome the disadvantages. Examples of the proposals include a photosensitive lithographic plate having an undercoating layer comprising a polyvinyl-phosphonic acid on the surface of an anodized aluminum plate and a photosensitive layer containing diazonium compound on the undercoating layer (West German Patent No. 1,621,478), a photosensitive lithographic plate having an undercoating layer (e.g., of polyacrylic acid) on an aluminum substrate and a photosensitive layer comprising diazo resin on the undercoating layer (West German Patent No. 1,091,433), a photosensitive lithographic plate having an undercoating layer of polyacrylamide and a photosensitive layer on the undercoating layer (U.S. Pat. No. 3,511,661), the addition of a high molecular organic acid into a photosensitive layer which comprises a diazonium compound and an organic polymer-carrier in order to improve storage-stability and to prevent background contamination (Japanease Patent Published Unexamined Application (hereinafter referred to as J. P. KOKAI) No. 56-107,238). However, all the above proposals remain inefficient in terms of improving the stability of the lithographic plate. Therefore, further improvements have been desired. U.S. Pat. No. 4,408,532 discloses a photosensitive composition comprising a diazo resin having multiple diazonium side chain groups in combination with a sulfonated polymer having multiple sulufonate groups such as a sulfonated polyurethane or a sulfonated polyester. However, the composition fails to give sufficient improvement with regard to reducing background contamintaion in printing, and the use of the composition is quite nallowly restricted because the composition is used as a photosensitive layer so that the properties of the photosensitive lithographic plate is necessarily determined by the properties of the sulfonated polyurethane or sulfonated polyester.

SUMMARY OF THE INVENTION

An object of the present invention is to provide a photosensitive recording material having a photosensitive layer on the surface of a substrate, which has an excellent developing property in a developing process after imagewise exposure to light.

More specifically, an object of the present invention is to provide a negative-working photosensitive lithographic plate having an undercoating layer, which, after imagewise exposure and subsequent developing, can provide a lithographic plate free from background contamination in printing, even though the lithographic plate is produced after long time storage of the photosensitive lithographic plate or after storage under a hot and humid condition.

The inventors of this invention have conducted various studies to achieve the foregoing objects and have found that the objects can effectively attained by applying a novel undercoating layer on a substrate and then applying a photosensitive composition thereon.

According to the present invention, there is provided a photosensitive recording material comprising (a) a substrate having a hydrophilic surface, (b) an undercoating layer comprising at least one compound having at least one functional group selected from the group consisting of thiol, thioether, and disulfide, and (c) a photosensitive layer comprising a diazonium compound and a high molecular compound which is insoluble in water and soluble in aqueous alkaline solution.

DETAILED EXPLANATION OF THE INVENTION

A detailed description will be made hereinunder as to the the components of the photosensitive recording material of the present invention and a process of producing and a method of using thereof, especially as to a photosensitive lithographic plate which is a preferred embodiment of the present invention.

SUBSTRATE

Examples of the substrate used in the present invention are, for example, paper; paper laminated with a plastics (such as polyethylene, polypropylene, or polystyrene etc.), metal plates such as aluminum (including aluminum alloys), zinc, and copper plates; plastic films such as cellulose diacetate, cellulose triacetate, cellulose propionate, cellulose butyrate, cellulose acetate butyrate, cellulose nitrate, polyethylene terephthalate, polyethylene, polystylene, polypropylene, polycarbonate, and polyvinyl acetal films; and paper or plastic films laminated with the above-mentioned metals or on which these metals are vapor-deposited. Among these substrates, aluminum plates are particularly preferred, since they are dimensionally quite satable and inexpensive. Further, composite substrates having an aluminum sheet applied on a polyethyleneterephthalate film, such as disclosed in British Pat. No. 1,329,714 are also preferred.

It is preferred that the substrates having metallic surface, especially aluminum surface, are made hydrophilic.

Processes in which aluminum surface is made hydrophilic include a step in which the surface of the aluminum plate is roughened by, for example, a mechanical graining method, e.g., a wire brush graining method, a brush graining method in which the surface is roughened with a nylon brush while a slurry of abrasive grains is poured thereon, or a ball graining method, a chemical graining method using HF, AlCl$_3$, or HCl as an etchant, an electrolytic graining using nitric acid or chloric acid as an electrolyte, and a combined graining method in which a combination of these methods is employed. The plate preferably are then, if necessary, subjected to etching process using an acid or alkaline ethcing agent, followed by anodic oxidation in sulfuric acid, phosphoric acid, oxalic acid, boric acid, chromic acid, sulfamic acid or a mixture of these acids using a direct or alternating current power source to form a firm film in a passive state on the aluminum surface. Although the aluminum surface is made hydrophilic by forming such a film in a passive state, it is particularly preferred to subject it to a further treatment with a silicate (such as sodium silicate or potassium silicate) as described in U.S. Pat. Nos. 2,714,066 and 3,181,461, treatment with potassium fluorozirconate as described in U.S. Pat. No. 2,946,638, treatment with a phosphomolybdate as described in U.S. Pat. No. 3,201,247, treatment with an alkyltitanate as described in British Pat. No. 1,108,559, treatment with polyacrylic acid as described in West German Pat. No. 1,091,433, treatment with polyvinyl phosphonic acid as described in West German Patent No. 1,134,093 and British Patent No. 1,230,447, treatment with phosphonic acid as described in Japanese Patent Publication (hereinafter referred to as J.P. KOKOKU) No. 44-6,409, treatment with phytic acid as described in U.S. Pat. No. 3,307,951, treatment with a hydrophilic organic polymer and a divalent metal as described in J.P. KOKAI Nos. 58-16,893 and 58-18,291. Further, the substrate can be made hydrophilic as well by electrodeposition of a silicate as described in U.S. Pat. No. 3,658,662. Undercoating layer Undercoating layer of the present invention comprises at least one compound having at least one functional group selected from the group consisting of thiol, thioether, and disulfide groups.

A compound used in the undercoating layer of the present invention has at least one functional group selected from the group consisting of thiol group (HS—), thioether group (—S—), and disulfide group (—S—S—). Preferably, the compound is further substituted with at least one alkaline-soluble group, or hydrophilic group such as hydroxyl or ether group.

The alkaline-soluble group may be acidic functional group such as —COOH, —SO$_3$H, —CONHCO—, —SO$_2$—NH$_2$, —SO$_2$—NH—, —SO$_2$—NH—CO—, —SO$_2$—NH—CO—O—, and —SO$_2$—NH—CO—NH—, and hydroxyphenyl group. A compound having more than one HS— group is also preferable.

In the invention, it is preferable to use a compound having a boiling point of not less than 100° C. (1 atm) since a compound having divalent sulfur atom generally emits an offensive odor. Molecular weight of the compound is preferably not less than 80, more preferably 100 to 1000.

The compound having at least one functional group selected from the group consisting of thiol, thioether, and disulfide groups may be, for example, mercaptoacetic acid, 2-mercaptopropionic acid, 3-mercaptopropionic acid, 4-mercaptobutanoic acid, 2,4-dimercaptobutanoic acid, 2-mercaptotetradecanoic acid, 2-mercaptomyristic acid, mercaptosuccinic acid, 2,3-dimercaptosuccinic acid, cysteine, N-acetylcysteine, N-(2-mercaptopropionyl)glycine, N-(2-mercapto-2-methylpropionyl)glycine, N-(3-mercaptopropionyl)glycine, N-(2-mercapto-2-methylpropionyl)cysteine, penicillamine, N-acetylpenicillamine, condensate of glycine.cysteine.glutamine, N-(2,3-dimercaptopropionyl)glycine, 2-mercaptonicotinic acid, thiosalicylic acid, 3-mercaptobenzoic acid, 4-mercaptobenzoic acid, 3-carboxy-2-mercaptopyridine, 2-mercaptobenzothiazol-5-carboxylic acid, 2-mercapto-3-phenylpropenic acid, 2-mercapto-5-carboxyethylimidazole, 5-mercapto-1-(4-carboxyphenyl)tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio)-hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesufonamide, 2-mercaptobenzimidazol-5-sulfonamide, 3-mercapto-4-(2-(methylaminosulfonyl)ethoxy)toluene, 3-mercapto-4-(2-(methylsulfonylamino)ethoxy)toluene, 4-mercapto-N-(p-m ethylphenylsulfonyl)benzamido, 4-mercaptophenol, 3-mercaptophenol, 2-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptan, 2-mercapto-4-octylphenylether methylether, 2-mercapto-4-octylphenol methanesulfonylaminoethylether, 2-mercapto-4-octylphenol methylaminosulfonylbutylether, thiodiglycolic acid, thiodiphenol, 6,8-dithiooctanoic acid, and alkali metal, alkali earth metal, and organic ammonium salts thereof.

The compound having at least one functional group selected from the group consisting of thiol, thioether, and disulfide groups may be used alone or as admixture of more than one compounds.

In addition to the foregoing compounds, the undercoating layer of the present invention may contain other compounds, for example, water-soluble polymer having sulfonic acid group as disclosed in U.S. Pat. No. 4,578,342.

The above-mentioned compound may be dissolved into a solvent and coated onto the surface of the substrate to form the undercoating layer. Examples of the solvents include, for example, water, methanol, ethanol, isopropanol, n-butanol, tert-butanol, ethylenedichloride, cyclohexanone, acetone, methyl ethyl ketone, ethyleneglycol, ethyleneglycol monomethyl ether, ethyleneglycol monoethyl ether, 2-methoxyethylacetate, 1-methoxy-2-propanol, 1-methoxy-2-propylacetate, N,N-dimethylformamide, tetrahydrofuran, dioxane, dimethylsulfoxide, ethyl acetate, methyl lactate, and ethyl lactate and mixtures thereof.

It is preferred to dry the coated layer at 50°–120° C. for 20 seconds—3 minutes after applying the solution of the compound.

The amount of the undercoating layer is preferably 1–500 mg/m$^2$ and more preferably 5–100 mg/m$^2$ after drying. Photosensitive layer The photosensitive composition of the photosensitive layer may include the following components:

(a) Negative-working diazonium compound

The diazonium compounds used in the present invention includes those described in U.S. Pat. Nos. 3,867,147 and 2,632,703. Diazo resins exemplified by condensates of an aromatic diazonium salt and, for instance, a reactive carbonyl-containing compound such as formaldehyde are particularly useful. Preferred diazo resins include hexafluorophosphate, tetrafluoroborate and phosphate of a condensate of p-diazodiphenylamine and formaldehyde or acetaldehyde. Further, sulfonate of a condensate of p-diazodiphenylamine and formaldehyde (for instance, p-toluenesulfonate, dodecylbenzenesulfonate and 2-methoxy-4-hydroxy-5-benzoylbenzenesulfonate) as described in U.S. Pat. No. 3,300,309, phosphinate (for instance, benzenephosphinate), salts of hydroxyl group-containing compounds (for instance, salt of 2,4-dihydroxybenzophenone) and organic carboxylate are also preferred.

In addition, mesitylene sulfonate of a condensate of 3-methoxy-4-diazo-diphenylamine and 4,4'-bis-methoxy-methyl-diphenylether as described in Canadian Pat. 1,172,492 is also suitable.

Further, the compound having at least one functional group selected from the group consisting of thiol, thioether, and disulfide groups and further substituted with an acidic group such as sulfonic group can be used as a counter-anion for a diazonium cation.

The content of the diazonium compound in the photo sensitive composition is 1 to 50 wt. %, preferably 3 to 20 wt. % based on the total weight of solid components. If necessary, two or more diazonium compounds may be used in combination.

(b) High molecular weight binder compound insoluble in water and soluble in alkaline solution Examples of the high molecular weight binder compound used in the present invention which is insoluble in water and soluble in aqueous alkaline solution include the following compounds: a polymer having phenolic hydroxyl groups such as phenol-formaldehyde resin, cresol-formaldehyde resin, phenol modified xylene resin, polyhydroxystyrene, polyhalogenatedhydroxystyrene, co-polymer essentially composed of acrylic acid, methacrylic acid, and crotonic acid or maleic acid, multi-component co-polymer composed of 2-hydroxyethylacrylate or 2-hydroxyethylmethacrylate, acrylonitrile or methacrylonitrile, acrylic acid or methacrylic acid, and, if necesarry, other co-polymerizable monomer such as described in U.S. Pat. No. 4,123,276, multi-component co-polymer having terminal hydroxyl group which composed of ester of acrylic acid or methacrylic acid esterified with a group having dicarboxylic ester group, acrylic acid or methacrylic acid, and, if necesarry, other co-polymerizable monomer as described in J.P. KOKAI, No. 53-120,903, multi-component co-polymer composed of alkylacrylate, acrylonitrile or methacrylonitrile, and unsaturated carboxylic acid as described in J.P. KOKAI No. 56-4144. Derivatives of acidic polyvinylalcohol and derivatives of acidic cellulose are useful polymers as well. Alkaline soluble polyvinyl acetals and alkaline soluble polyurethanes such as disclosed in U.S. Pat. Nos. 3,732,105, 4,387,151, 4,631,245, and 4,741,985 and British Pat. No. 2,185,120 are also useful.

In addition, the high molecular compounds preferably used in the present invention include the polymer compounds composed of at least one of the repeating units of the following general formulas (I)–(IV):

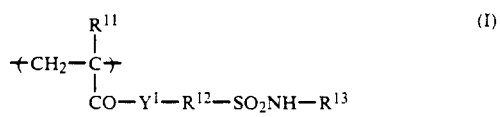

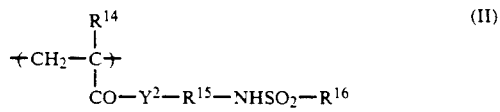

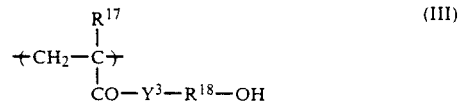

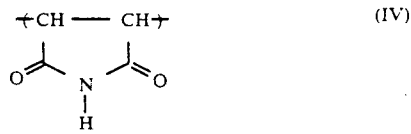

wherein R$^{11}$, R$^{14}$, and R$^{17}$ may be same or different and represent —H or —CH$_3$, R$^{12}$ and R$^{15}$ may be same or different and represent C$_1$–C$_{12}$ alkylene, cycloalkylene, arylene, or aralkylene group which may be occasionally substituted, R$^{18}$ represents C$_6$–C$_{12}$ arylene group which may be occasionally substituted, R$^{13}$ represents —H or C$_1$–C$_{12}$ alkyl, cycloalkyl, aryl, or aralkyl group which may be occasionally substituted, R$^{16}$ represents C$_1$–C$_{12}$ alkyl, cycloalkyl, aryl, or aralkyl group which may be occasionally substituted, and Y$^1$, Y$^2$, and Y$^3$ may be same or different and represent —O— or —NH—.

The polymer compound preferably used in the present invention composed of at least one of the repeating units of general formulas (I)–(IV) can be synthesized by polymerization of one or more monomer-compounds selected from the group consisting of the following general formulas (V)–(VIII), or by co-polimerization of the monomer of formulas (V)–(VIII) with one or more other polymerizable unsaturated monomers.

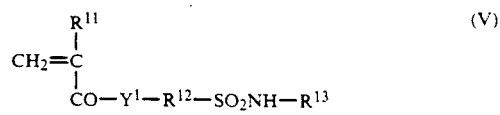

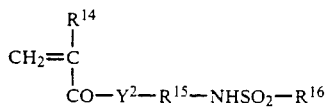

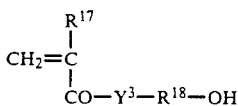

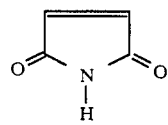

wherein, $R^{11}$-$R^{18}$ and $Y^1$-$Y^3$ represent the same as defined in the general formulas (I)-(IV).

The other polymerizable unsaturated monomer compounds used in the present invention include acrylic acid, methacrylic acid, acrylic acid esters, methacrylic acid esters, acrylonitrile, methacrylonitrile, acrylamides, methacrylamides, allyl compounds, vinyl ethers, vinyl esters, styrenes, and crotonic acid esters etc. Among these polymerizable unsaturated monomers, preferably used are methacrylic acid esters, acrylic acid esters, methacrylamides, acrylamides, acrylonitrile, methacrylonitrile, methacrylic acid, and acrylic acid.

The polymer compound used in the present invention may be produced by a co-polymerizaion of one or more monomers selected from the group consisting of the monomers of general formula (V)-(VIII) with one or more other polymerizable unsaturated monomers mentioned above. The polymer may be a block polymer, a random polymer, or a graft polymer.

The content of the monomer units (I)-(IV) in the co-polymer is preferably not less than 5 mol %, more preferably 10-90 mol % based on the total repeating units of the co-polymer.

The molecular weight of the polymer used in the present invention is preferably not less than average weight of 2,000, more preferably 5,000 to 300,000.

Examples of the solvent used in the preparation of the polymer include ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-methoxy-2-propylacetate, N,N-dimethylformamide, toluene, ethyl acetate, methyl lactate, ethyl lactate and the mixtures thereof.

The polymer compounds most preferably used in the present invention include a polymer produced by the co-polymerizaion of multiple components selected from each of the following groups (A)-(D). One or more components may be selected from each group.

Group (A) consists of compounds represented by the aforementioned general formulas (V)-(VIII).

Group (B) consists of acrylonitrile, methacrylonitrile, and compounds represented by the following general formula (IX):

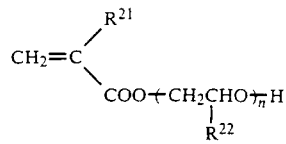

wherein $R^{21}$ represents —H or —CH$_3$, $R^{22}$ represents —H, —CH$_3$, —CH$_2$Cl, or —CH$_2$CH$_3$, and n represents an integer of from 1 to 10.

Group (C) consists of compounds represented by the following general formula (X):

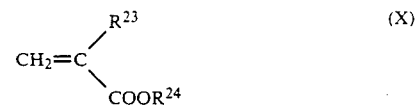

wherein $R^{23}$ represents —H or —CH$_3$, $R^{24}$ represents —H, C$_1$-C$_{12}$ alkyl, cycloalkyl, aryl, and aralkyl group which may be occasionally substituted.

Group (D) consists of acrylic acid, methacrylic acid, and compounds represented by the following formula (XI):

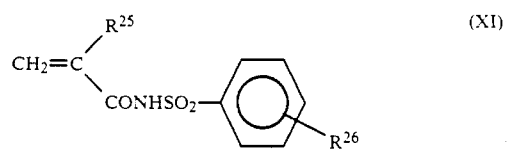

wherein $R^{25}$ represents —H or —CH$_3$, and $R^{26}$ represents —H, —CH$_3$, or a halogen atom.

The amount of the polymer compound in the photosensitive layer is about 5 to 95 wt. %, preferably about 10 to 85 wt. % based on the total solid component.

(c) Other additives

The negative-working photosensitive composition may contain agents or compositions for obtaining a visible image immediately after imagewise exposure, dyes for coloring the image area, pigments, stabilizers, surfactants, plasticizers, and other fillers.

Examples of agents or compositions for obtaining a visible image immediately after imagewise exposure include a combimation of a photosensitive compound which releases acid upon exposure to light and an organic dye compound which can form a salt with the photosensitive compound. Examples of the agents or compositions include a combination of o-naphthoquinonediazide-4-sulfonic acid halide and a salt-formable organic dye as described in U.S. Pat. No. 3,969,118 and J.P. KOKAI No. 53-8,128, and a combination comprises a tri-halogenated-methyl compound and a salt formable organic dye as described in U.S. Pat. Nos. 4,160,671 and 4,232,106. As agents for coloring the image area, other dyes as well as the salt formable organic dyes as mentioned above can be used. The preferred dye includes oil-soluble dyes and basic dyes including the salt formable organic dyes. Examples of the dyes include Oil Yellow #101, Oil Yellow #130, Oil Pink #312, Oil Green BG, Oil Blue BOS, Oil Blue #603, Oil Black BY, Oil Black BS, Oil Black T-505 (Orient Chemical Ind. Ltd.), Victoria Pure Blue, Crystal Violet (C.I.42555), Methyl Violet (C.I.42535), Rhodamine B (C.I.45170B), Malachite Green (C.I.42000), and Methylene Blue (C.I.52015).

Examples of the stabilizers for diazonium compounds include phosphoric acid, phosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbezenesulfonic acid, malic acid, tartaric acid, dipicolinic acid, polymers and copolymers of acrylic acid, polymers and copolymers of vinylphosphonic acid, polymers and copolymers of vinylsulfonic acid, 5-nitronaphthalene-1-phosphonic acid, 4-chlorophenoxymethylphosphonic acid, sodium phenyl-methyl-pyrazolonesulfonate, 2-phosphonobutanetricarboxylic acid-1,2,4, 1-phosphonoethanetricarboxylic acid-1,2,2 and 1-hydroxyethane-1,1-disulfonic acid.

Various additives can be added to the photosensitive composition used in the present invention. These include, for example, alkyl ethers (such as ethylcellulose and methylcellulose) and surfactants (e.g., a fluorine atom containing surfactant such as 3M's Fluorad FC-430) for improving coating properties, plasticizers for imparting flexibility and abrasion resistance to the coating film (such as tricresyl phosphate, dimethyl phthalate, dibutyl phthalate, trioctyl phosphate, tributyl phosphate, tributyl citrate, polyethylene glycol and polypropylene glycol).

Further, the compounds having at least one functional group selected from the group consisting of thiol, thioether, and disulfide groups may be added into the photosensitive composition.

Although the amount of these additives varies depending on the object, it is usually 0.5 to 30 wt. % based on the total solid content of the photosensitive layer.

The foregoing photo-sensitive composition is dissoloved in a solvent which can dissolve any component mentioned above, and then coated onto the aforementioned substrate. Examples of the solvent include methanol, ethanol, isopropanol, n-butanol, t-butanol, ethylenedichloride, cyclohexanone, acetone, methyl ethyl ketone, ethyleneglycol, ethylene glycol monomethyl ether (2-methoxyethanol), ethylene glycol monoethyl ether, 2-methoxyethylacetate, 1-methoxy-2-propanol, 1-methoxy-2-propylacetate, N,N-dimethylformamide, tetrahydrofurane, dioxane, dimethylsulfoxide, ethyl acetate, methyl lactate, ethyl lactate and mixtures threreof.

In addition, the solvent above may be suitably used in admixture with an small amount of other solvent which do not dissolve the diazo resins or the polymers (e.g., water or toluene). The concentration of the above mentioned component (solid component) in the solvent is 1 to 50% by weight.

It is desirable that the solution of the photosensitive composition in the solvent is dried at 50°–120° C. after coated onto the substrate. The solution may be dried at a high temperature after pre-dried at a low temperature, or alternatively, it may be dried directly at a high temperature without pre-drying process where an appropriate solvent is used in a suitable concentration of the photosensitive composition. The solution may be dried preferably for from 20 sec. to 3 min., although it may be shorter or longer.

Although the amount of the photosensitive composition may vary depending on the object, it is generally 0.5 to 3.0 g/m² in terms of solids in the case of photosensitive lithographic plates. As the amount of the photosensitive composition coated decreases, photosensitivity becomes higher but the pysical properties of the photosensitive layer become lower.

The photosensitive recording material of the present invention, for example photosensitive lithographic plate, is exposed to light through a transparent original film having a line image or dotted image and developed with an aqueous alkaline developing solution to yield a negative relief image of the original image.

Examples of light sources used for exposure include carbon arc lamps, marcury lamps, xenon lamps, metal halide lamps, stroboscopes, ultraviolet rays and laser beams.

The aqueous alkaline developing solution used for developing the photosensitive recording material of the present invention have pHs in the range of 8 to 13.5 and contain water not less than 75% by weight. Examples of alkaline agents include inorganic alkaline agents such as sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate, and ammonia, and organic aminocompounds such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine, pyridine, and mixtures thereof.

Among them, sodium silicate, potassium silicate, potassium hydroxide, sodium hydroxide, monoethanolamine, diethanolamine and triethanolamine are particularly preferred, which may be used alone or in combination.

The amount of the alkaline agent in the aqueous alkaline developer is 0.05 to 10% by weight, preferably 0.1 to 7% by weight.

The aqueous alkaline developer may contain a surfactant or an organic solvent as required. Examples of the surfactant include anionic surfactant such as sodium lauryl sulfate, sodium octyl sulfate, ammonium lauryl sulfate, salts of sulfric acid esters of $C_8$–$C_{22}$ alcohols such as secondary sodium alkyl sulfate, salts of phosphoric acid esters of aliphatic alcohols such as sodium cetyl phosphate, alkyl aryl sulfonates such as sodium dodecylbenzene sulfonate, sodium isopropylnaphthalene sulfonate, sodium m-nitrobenzene sulfonate, alkylamide sulfonates such as $C_{17}H_{33}$-CON($CH_3$) —$CH_2$—$CH_2$—$SO_3Na$, sulfonates of di-basic aliphatic acid esters such as sodium dioctyl sulfosuccinate and sodium dihexyl sulfosuccinate, sulfonates having aryl group as well as oxyalkylene group such as

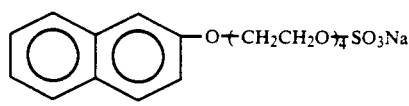

and amphoteric surfactant such as imidazoline derivatives and betain compounds.

The organic solvents suitablly used are those having water solubility at room temperature of not more than 10% by weight, preferably not more than 5% by weight. Examples of the solvents include 1-phenylethanol, 2-phenylethanol, 3-phenylpropanol-1, 4-phenylbutanol-1, 4-phenylbutanol-2, 2-phenylbutanol-1, 2- phenoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 4-methylcyclohexanol, and 3-methylcyclohexanol. Further, an anti-forming agent or a water softener may be added as required.

In addition, reducing inorganic salts or the aforementioned compound having at least one functional group selected from the group consisting of thiol, thioether, and disulfide group may be added as required.

Examples of the reducing inorganic salts include sulfites such as sodium sulfite, potassium sulfite, aluminum sulfite, lithium sulfite, magnesium sulfite, sodium hydrogensulfite, and potassium hydrogensulfite, phosphites such as sodium phosphite, potassium phosphite, sodium hydrogenphosphite, potassium hydrogenphosphite, sodium dihydrogenphosphite, and potassium dihydrogenphosphite.

The photosensitive recording material of the present invention can be developed by various methods such as tray-development, hand-development, or may be developed by using an automatic processor equipped with a developing compartment and a gumming-up compartment or a commonly used automatic processor equipped with a developing compartment and a washing compartment. Developing abilities of the aqueous alkaline developer are generally lowered during the developing of photosensitive lithographic plates of the present invention because the alkaline agent in the developer is consumed in propotion to the amount of the plates developed, or because carbon dioxide in the environment neutralizes the alkaline agent during a prolonged time of automatical processing. Such lowered abilities of the developer may be recovered by adding supplemental developer as disclosed in U.S. Pat. No. 4,259,434. Further processes such as desensitization after washing process, desensitization without washing process, treatment with an aqueous acidic solution, or desensitization after treated with an aqueous acidic solution may be added after developing process as required.

The lithographic printing plate is then set on a lithographic printing machine and subjected to printing.

From the foregoing description, it will be understood that the photosensitive recording material of the present invention has excellent developing properties with an alkaline developing solution. In the case of the negetive-working photosensitive lithographic plate, the resulting printing plate can yield many pieces of excellent printed matter without background contamination.

Further, the negative-working photosensitive lithographic plate of the present invention can be developed by a widely used developer known as a developer for positive-working photosensitive lithographic plate. In other words, one can properly develop the negative-working photosensitive lithographic plate of the present invention and a positive-working photosensitive lithographic plate by using the same developer. A conventionally used negative-working photosensitive lithographic plate can not be developed without leaving a resist film in unexposed areas with a known developer for a positive-working photosensitive plate which substantially does not contain organic solvents which results in improper developing so that yellow stains occur in unexposed areas. Even if the plate is developed properly by appearance, background contamination sometimes occur in printing process. The photosensitive recording material of the present invention, for example, negative-working photosensitive lithographic plate, can be developed properly by the developer for a positive-working photosensitive lithographic plate without causing aforementioned problems, and the resulting lithographic plate does not cause background contamintaion in non-image areas in printing process.

The invention will be further explained by the following non-limitative examples.

EXAMPLE 1

The polymers (a), (b), (c) and (d) used herein were prepared according to the methods described in J. P. KOKAI No. 50-118,802, J. P. KOKAI No. 61-275,838, J. P. KOKOKU No. 57-43,890, and J. P. KOKAI No. 60-115,932, respectively.

The weight-average (polystyrene standard) molecular weight of the polymers (a)–(d) were in the range of 20,000–100,000.

TABLE 1

| high molecular compound | repeating unit | | | | molar ratio |
|---|---|---|---|---|---|
| (a) | $-(CH_2-C(CH_3)(COOCH_2CH_2OH))-$ | $-(CH_2-CH(CN))-$ | $-(CH_2-C(CH_3)(COOCH_3))-$ | $-(CH_2-C(CH_3)(COOH))-$ | 36:35:25:4 |
| (b) | $-(CH_2-C(CH_3)(CO-NH-C_6H_4-SO_2NH_2))-$ | $-(CH_2-CH(CN))-$ | $-(CH_2-CH(COOCH_2CH_3))-$ | $-(CH_2-C(CH_3)(COOH))-$ | 11:25:55:9 |
| (c) | $-(CH_2-C(CH_3)(CO-NH-C_6H_4-OH))-$ | $-(CH_2-CH(CN))-$ | $-(CH_2-CH(COOCH_2CH_3))-$ | $-(CH_2-C(CH_3)(COOH))-$ | 10:28:53:9 |

TABLE 1-continued

| high molecular compound | repeating unit | molar ratio |
|---|---|---|
| (d) | $-(CH-CH)-$ with $O=C-N(H)-C=O$ ring, $-(CH_2-CH)-CN$, $-(CH_2-C(CH_3))-COOCH_2CH_2OH$, $-(CH_2-C(CH_3))-COOCH_3$, $-(CH_2-C(CH_3))-COOH$ | 18:35:18:25:4 |

An aluminum plate (JIS 1050A) of 0.24 mm in thickness was grained using nylon brush and an aqueous dispersion of 400 mesh pumice and then washed sufficiently with water. The plate was etched by dipping in a 10% aqueous sodium hydroxide solution at 70° C. for 60 sec. and then washed with running water. After washing with 20% nitric acid for neutralization, the plate was subjected to the electrochemical roughening process described in J.P. KOKAI No. 53-67,507 using a sinusoidal alternating wave current, where the electrolytic solution was a 1% aqueous nitric acid solution, and the anodic time quantity of electricity of 160 coulomb/dm$^2$ was used. Subsequently, the plate was dipped into a 30% aqueous sulfuric acid solution, desmutted at 55° C. for 2 minutes and then subjected to anodization in a 7% aqueous sulfuric acid solution to yield the amount of the aluminum oxide coating of 2.0 g/m$^2$. The plate was then dipped in a 3% aqueous sodium silicate (JIS No. 3) solution at 70° C. for 1 minute, washed with water and dried.

The following undercoating solution was coated using a whirler on the aluminum plate obtained above and dried at 80° C. for 30 seconds to give an undercoating layer of 20 mg/m$^2$ after drying.

| (Undercoating solution) | |
|---|---|
| 2-mercaptobenzoic acid | 0.4 g |
| Methanol | 100 g |

Subsequently, the following photo-sensitive solution was coated onto the undercoating layer using a whirler and dried at 80° C. for 2 minutes to give photosensitive lithographic plate I having the photo-sensitive layer of 2.0 g/m$^2$ after drying.

| (Photo-sensitive solution) | |
|---|---|
| Hexafluorophosphate of a condensate of 4-diazodiphenylamine and formaldehyde | 0.5 g |
| Polymer (a) | 5.0 g |
| Oil soluble dye (Victria Pure Blue BOH) | 0.1 g |
| Malic acid | 0.05 g |
| FC-430 (3M's fluorine atom containing surfactant) | 0.05 g |
| 2-methoxyethanol | 100 g |

Photosensitive lithographic plate II, III and IV were prepated by the same method as described above, except using polymer (b), (c), and (d) for polymer (a), respectively.

Comparative photosensitive lithographic plate I'-IV' were prepared by the same method as described above except that the undercoating layers were not applied and the photo sensitive layers were directly applied on the treated aluminum plate. Comparative photosensitive lithographic plate I', II', III' and IV' were prepared by using polymer (a), (b), (c) and (d), respectively.

Photosensitive lithographic plate I and comparative plate I' were separately imagewise exposed for 1 minute using a PS light (Fuji Photo Film Co., Ltd.) at a distance of 1 m. Subsequently, each plate was dipped in the following developing solutions at room temperature for one minute and rubbed lightly with absorbent cotton to remove the unexposed areas in the photo-sensitive layer.

| (Developing solutions) | |
|---|---|
| Sodium sulfite | 5 g |
| Benzyl alcohol | 40 g |
| Sodium carbonate | 5 g |
| Sodium isopropylnaphthalene sulfonate | 20 g |
| Water | 1,000 g |

Each printing plate thus prepared was used for printing on wood free paper using the printing machine (Heidelberg GTO printer) and an ink available in the market. After printing 500 sheets of paper, contamination in non-image areas on the printed matter was visually examined for each of the lithographic plate.

The paper printed by using the lithographic plate obtained from the photosensitive lithographic plate I of the present invention had no background contamination. On the contrary, the paper printed by using the lithographic plate obtained from the comparative photosensitive lithographic plate I' had a slight background contamination. These results show that the undercoating layer of the present invention has an advantageous effect on preventing background contamination.

The photosensitive lithographic plates II-IV of the present invention and the compatative photosensitive lithographic plates II'-IV' were imagewise exposed to light in the same manner as above, and the surfaces of the plates were rubbed lightly with absorbent cotton after dipping in the following developing solution T at room temperature for 1 minutes.

| (Developing solution T) | |
|---|---|
| Sodium silicate (molar ratio of SiO$_2$ to Na$_2$O = 1.1) | 20 g |
| Water | 1,000 g |

The lithographic plates thus obtained were used for printing in the same manner as described above.

The papers printed by the lithographic plates obtained from the photosensitive lithographic plates II-IV of the present invention had no background contamintaion. On the contrary, the paper printed by the plate obtained from the comparative photosensitive lithographic plates II'-IV' had background contamination. These results also reveal that the undercoating layer of the present invention is remarkably effective to prevent background contamination in printing process.

The positive-working photosensitive lithographic plate produced by the described method (U.S. Pat. No. 3,635,709) was developed by the above developing solution T after imagewise exposure, and the resulting lithographic plate was used to conduct printing, which gave no background contamination in the printed materials. These results show that the developing solution T, which does not contain organic solvent, can properly develop both the positive-working photosensitive lithographic plate and the negative-working photosensitive lithographic plate of the present invention. In other words, a developer which is substantially free from organic solvents can be used for developing both the negative-working photosensitive lithographic plate of the present invention and a positive-working photosensitive lithographic plate.

EXAMPLE 2

Each undercoating solution shown in Table 2 was applied using a whirler onto the aluminum plate obtained in example 1, and dried at 80° C. for 30 seconds to give an undercoating layer of 20 mg/m² after drying.

TABLE 2

| Plate No. | undercoating solution | |
|---|---|---|
| | Compound | Solvent |
| V | mercaptosuccinic acid 0.4 g | methanol 100 g |
| VI | 4-mercaptobenzene-sulfonic acid 0.4 g | methanol 100 g |
| VII | thiodiglycolic acid 0.4 g | methanol 100 g |

On the plates thus obtained, the photosensitive solution used in the preparation of plate II was applied using a whirler and dried at 80° C. for 2 minutes to give a photosensitive layer of 2.0 g/m² after drying.

The photosensitive lithographic plates were imagewise exposed for 1 minute using a PS light (FUJI Photo Film Co., Ltd.) at a distance of 1 m. Subsequently, each plate was dipped into the developing solution T at room temperature for one minute and rubbed lightly with absorbent cotton. The resulting lithographic plates were used to conduct printing on wood free paper using the Heidelberg GTO printer and an ink available in the market to examine background contamination by naked eyes.

The papers printed by the lithographic plate produced from the photosensitive lithographic plates V-VII of the present invention had no background contamination. On the contrary, the papers printed by the plate produced from the comparative photosensitive lithographic plate II' having no undercoating layer had background contamination, as mentioned in Example 1.

EXAMPLE 3

The photosensitive lithographic plate VIII of the present invention was prepared as follows: The same undercoating solution was applied in the same method as described in Example 1 onto the aluminum plate, and then the following photosensitive solution was applied onto the undercoating layer with a whirler and dried at 80° C. for 2 minutes to give a photosensitive layer of 1.5 g/m² after drying.

| (Photosensitive solution) | |
|---|---|
| 4-n-dodecylbenzensulfonate of a condensate of 4-diazodiphenylamine and formaldehyde | 0.5 g |
| Polymer (b) (shown in Table 1) | 5.0 g |
| Oil soluble dye (Victoria Pure Blue BOH) | 0.13 g |
| Malic acid | 0.05 g |
| FC-430 (3M's fluorine atom containing surfactanrt) | 0.06 g |
| 2-methoxyethanol | 120 g |

The comparative photosensitive lithographic plate V' was prepared by applying the above photosensitive solution in the same manner as described above except that the solution was directly applied onto the aluminum plate without appling undercoating layer and then dried.

Each photosensitive lithographic plate was imagewise exposed for 1 minute using a PS light (FUJI Photo Film Co., Ltd.) at a distance of 1 m. Subsequently, each plate was dipped into the developing solution T at room temperature for one minute and rubbed lightly with absorbent cotton. The resulting lithographic plates were used for printing on wood free paper using the Heidelberg GTO printer and an ink available in the market to examine background contamination by naked eyes.

The papers printed by the lithographic plate produced from the photosensitive lithographic plate VIII of the present invention had no background contamination. On the contrary, the papers printed by the plate produced from the comparative photosensitive lithographic plate V' having no undercoating layer had a slight background contamination.

What is claimed is:
1. A photosensitive recording material comprising:
   (a) an aluminum substrate having a hydrophilic surface,
   (b) an undercoating layer coated directly onto the surface of said substrate, said undercoating layer comprising at least one compound selected from the group consisting of 2-mercaptobenzoic acid, mercaptosuccinic acid, 4-mercaptobenzenesulfonic acid and thiodiglycolic acid, said at least one compound being included in an amount required to sufficiently improve developing property in a developing process after imagewise expose to light, and
   (c) a photosensitive layer comprising an admixture of a diazonium compound in an amount required to sufficiently make the photosensitive layer photosensitive and a high molecular weight binder compound which is insoluble in water and soluble in an aqueous alkaline solution in an amount of 5-95% by weight based on the total photosensitive layer.

2. A photosensitive recording material according to claim 1, wherein said material is a photosensitive lithographic plate.

3. A photosensitive recording material according to claim 1, wherein the surface of said substrate is made hydrophilic by anodic oxidation followed by a treatment with a silicate.

4. A photosensitive recording material according to claim 1, wherein the compound used in the undercoating layer further contains at least one alkaline-soluble group or hydrophilic group.

5. A photosensitive recording material according to claim 4, wherein the alkaline-soluble group is selected from the group consisting of —COOH, —SO₃H, —CONHCO—, —SO$_2$NH$_2$, —SO$_2$NH—, —SO$_2$—NH—CO—, —SO$_2$—NH—CO—O—, —SO$_2$—NH—CO—NH—, hydroxyphenyl and —SH.

6. A photosensitive recording material according to claim 4, wherein said hydrophilic group is selected from the group consisting of hydroxyl and ether groups.

7. A photosensitive recording material according to claim 1, wherein the amount of the undercoating layer is 1–500 mg/m$^2$ after drying.

8. A photosensitive recording material according to claim 1, wherein the amount of the undercoating layer is 6–100 mg/m$^2$ after drying.

9. A photosensitive recording material according to claim 1, wherein the diazonium compound is a condensate of an aromatic diazonium salt and a reactive carbonyl-containing compound.

10. A photosensitive recording material according to claim 1, wherein the diazonium compound is selected from the group consisting of 4-n-dodecylbenzensulfonate of a condensate of 4-diazodiphenylamine and formaldehyde and hexafluorophosphate of a condensate of 4-diazodiphenylamine and formaldehyde.

11. A photosensitive recording material according to claim 1, wherein the amount of the diazonium compound is 1 to 50 wt. % based on the total weight of solid components of the photosensitive composition.

12. A photosensitive recording material according to claim 1, wherein the amount of the diazonium compound is 3 to 20 wt. % based on the total weight of solid components of the photosensitive composition.

13. A photosensitive recording material according to claim 1, wherein the high molecular weight binder compound comprises at least one repeating unit of the general formulas (I)–(IV):

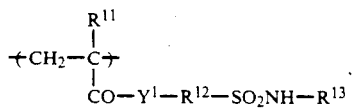 (I)

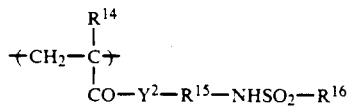 (II)

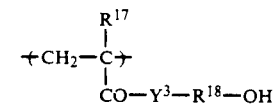 (III)

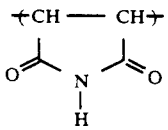 (IV)

wherein R$^{11}$, R$^{14}$, and R$^{17}$ may be same or different and represent —H or —CH$_3$, R$^{12}$ and R$^{15}$ may be same or different and represent C$_1$–C$_{12}$ alkylene, cycloalkylene, arylene, or aralkylene group which may be occasionally substituted, R$^{18}$ represents C$_6$–C$_{12}$ arylene group which may be occasionally substituted, R$^{13}$ represents —H or C$_1$–C$_{12}$ alkyl, cycloalkyl, aryl, or aralkyl group which may be occasionally substituted, R$^{16}$ represents C$_1$–C$_{12}$ alkyl, cycloalkyl, aryl, or aralkyl group which may be occasionally substituted, and Y$^1$, Y$^2$, and Y$^3$ may be same or different and represent —O— or —NH—.

14. A photosensitive recording material according to claim 1, wherein the high molecular compound is produced by a co-polymerizaion of one or more polymerizable unsaturated monomers with one or more monomers selected from the group consisting of the monomers of general formulas (V)–(VIII):

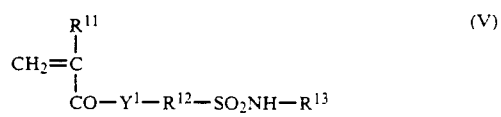 (V)

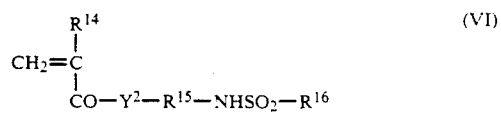 (VI)

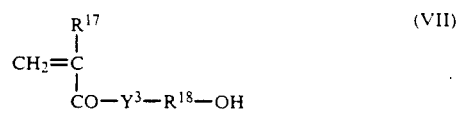 (VII)

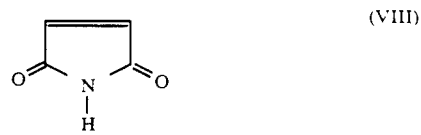 (VIII)

wherein R$^{11}$, R$^{14}$, and R$^{17}$ may be same or different and represent —H or —CH$_3$, R$^{12}$ and R$^{15}$ may be same or different and represent C$_1$–C$_{12}$ alkylene, cycloalkylene, arylene, or aralkylene group which may be occasionally substituted, R$^{18}$ represents C$_6$–C$_{12}$ arylene group which may be occasionally substituted, R$^{13}$ represents —H or C$_1$–C$_{12}$ alkyl, cycloalkyl, aryl, or aralkyl group which may be occasionally substituted, R$^{16}$ represents C$_1$–C$_{12}$ alkyl, cycloalkyl, aryl, or aralkyl group which may be occasionally substituted, and Y$^1$, Y$^2$, and Y$^3$ may be same or different and represent —O— or —NH—.

15. A photosensitive recording material according to claim 14, wherein the polymerizable unsaturated monomer is selected from the group consisting of methacrylic acid esters, acrylic acid esters, methacrylamides, acrylamides, acrylonitrile, methacrylonitrile, methacrylic acid and acrylic acid.

* * * * *